US006678062B2

(12) United States Patent
Haugen et al.

(10) Patent No.: US 6,678,062 B2
(45) Date of Patent: Jan. 13, 2004

(54) AUTOMATED SYSTEM WITH IMPROVED HEIGHT SENSING

(75) Inventors: Paul R. Haugen, Bloomington, MN (US); David Fishbaine, Minnetonka, MN (US); Eric P. Rudd, Hopkins, MN (US); David M. Kranz, Minneapolis, MN (US); Carl E. Haugen, St. Paul, MN (US); Adam Reinhardt, Little Canada, MN (US)

(73) Assignee: CyberOptics Corporation, Golden Valley, MN (US)

( * ) Notice: Subject to any disclaimer, the term of this patent is extended or adjusted under 35 U.S.C. 154(b) by 0 days.

(21) Appl. No.: 10/021,288

(22) Filed: Dec. 7, 2001

(65) Prior Publication Data

US 2002/0078580 A1 Jun. 27, 2002

Related U.S. Application Data

(60) Provisional application No. 60/254,247, filed on Dec. 8, 2000, and provisional application No. 60/275,281, filed on Mar. 13, 2001.

(51) Int. Cl.[7] .................................................. G01B 5/25
(52) U.S. Cl. ............................ 356/623; 33/559; 33/533; 356/623; 356/601
(58) Field of Search ...................... 33/533, 645, 613, 33/1 M, 228, 286, 701, 712, 556, 558, 559, 561; 356/623, 614, 601, 301–3.1; 73/105; 901/16, 46, 47, 41

(56) References Cited

U.S. PATENT DOCUMENTS

| | | | |
|---|---|---|---|
| 4,373,804 A | 2/1983 | Pryor et al. ..................... 356/1 |
| 4,660,970 A | 4/1987 | Ferrano ........................... 356/1 |
| 4,835,689 A * | 5/1989 | O'Donnell .................... 250/580 |
| 4,978,220 A | 12/1990 | Abramovich et al. ........ 356/394 |
| 4,979,815 A | 12/1990 | Tsikos ............................. 356/1 |
| 4,999,014 A * | 3/1991 | Gold et al. ................... 356/632 |
| 5,086,556 A | 2/1992 | Toi ................................ 29/740 |
| 5,105,075 A * | 4/1992 | Ohta et al. ................. 250/201.2 |
| 5,298,977 A | 3/1994 | Shintani et al. ............. 356/376 |
| 5,404,163 A | 4/1995 | Kubo ........................... 348/142 |
| 5,570,993 A * | 11/1996 | Onodera et al. ............. 414/783 |
| 5,576,831 A * | 11/1996 | Nikoonahad et al. ........ 356/623 |
| 5,739,846 A | 4/1998 | Gieskes ........................ 348/87 |
| 5,760,893 A * | 6/1998 | Raymond ................. 356/237.1 |
| 5,773,840 A | 6/1998 | Pryor et al. ............. 250/559.31 |
| 5,780,866 A | 7/1998 | Yamamura et al. ..... 250/559.22 |
| 5,900,940 A * | 5/1999 | Aoshima .................... 356/614 |
| 5,903,662 A * | 5/1999 | DeCarlo ..................... 382/151 |
| 5,910,845 A | 6/1999 | Brown ........................ 356/376 |

(List continued on next page.)

FOREIGN PATENT DOCUMENTS

| | | |
|---|---|---|
| EP | 0 336 563 B1 | 9/1993 |
| EP | 0 371 650 B1 | 1/1994 |
| EP | 0 312 046 B1 | 7/1994 |
| WO | WO 01/67831 A2 | 9/2001 |
| WO | WO 02/29357 A2 | 4/2002 |

Primary Examiner—Christopher W. Fulton
Assistant Examiner—Amy R Cohen
(74) Attorney, Agent, or Firm—Westman, Champlin & Kelly, P.A.

(57) ABSTRACT

An automated system includes improved height sensing. In one aspect, a on-head camera performs the dual functions of fiducial imaging and height sensing using an auxiliary off-axis light source and triangulation. In another aspect, an on-head height sensor is positioned to measure height at a location that is not beneath any nozzles. The sensor provides height information at a plurality of locations over the board, and a height map of the board is created. In yet another aspect of the invention, the above features are combined to provide an on-head camera that images fiducials and measures height at a plurality of locations such that a height map is created.

32 Claims, 7 Drawing Sheets

U.S. PATENT DOCUMENTS

| | | | | |
|---|---|---|---|---|
| 5,912,731 A | * | 6/1999 | DeLong et al. | 356/121 |
| 5,912,739 A | * | 6/1999 | Fowler et al. | 356/613 |
| 5,926,278 A | | 7/1999 | Asai | 356/376 |
| 5,969,820 A | * | 10/1999 | Yoshii et al. | 356/623 |
| 5,978,089 A | | 11/1999 | Horovitz | 356/376 |
| 5,982,494 A | * | 11/1999 | Hercher | 356/620 |
| 6,115,491 A | * | 9/2000 | Rudd et al. | 382/154 |
| 6,118,540 A | | 9/2000 | Roy et al. | 356/394 |
| 6,222,628 B1 | * | 4/2001 | Corallo et al. | 356/601 |
| 6,222,629 B1 | * | 4/2001 | Morris | 356/601 |
| 6,222,630 B1 | | 4/2001 | Wasserman | 356/388 |
| 6,350,980 B1 | * | 2/2002 | Bohn | 250/208.1 |
| 6,356,093 B2 | * | 3/2002 | Nishikawa et al. | 324/758 |
| 6,436,726 B2 | * | 8/2002 | Look et al. | 438/17 |
| 6,463,359 B2 | * | 10/2002 | Fischer | 700/254 |
| 6,486,964 B2 | * | 11/2002 | Shitamichi | 356/614 |
| 6,496,270 B1 | * | 12/2002 | Kelley et al. | 356/602 |

* cited by examiner

AUTOMATED SYSTEM WITH IMPROVED HEIGHT SENSING

CROSS REFERENCE TO RELATED APPLICATIONS

This application claims priority to prior provisional application No. 60/254,247 filed Dec. 8, 2000 entitled DISTANCE TO BOARD SENSOR AND METHOD FOR CONTOURING THE SURFACE OF A PC BOARD; and to prior provisional application No. 60/275,281 filed Mar. 13, 2001 entitled LASER TRIANGULATION RANGE WHICH USES COMMON CCD AS IS USED BY MAIN CAMERA.

COPYRIGHT RESERVATION

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

The present invention relates generally to a system for obtaining distance to target information in automated assembly and/or inspection machines.

Pick and place machines and solder paste inspection machines are common types of automated electronics processing machines. Pick and place machines are used in the surface mount technology (SMT) field to automatically place electronics components upon a circuit board during manufacture. Solder paste inspection machines are used to inspect small amounts of solder that are deposited upon a circuit board prior to placement of components thereon. Knowing the height between a workpiece, such as a circuit board, and the machine provides a number of advantages. First, in inspection machines, the Z-axis can be actuated to drive the an inspection camera towards or away from the workpiece so as to place the workpiece in the camera's depth of field (i.e. focus).

Pick and place machines usually have a nozzle or quill that uses a vacuum to pick up a component, move the component to a desired location and lower the component onto the board. Knowing the height between the placement head and the board during placement provides the following advantages. First, if height is accurately known, the placement head can lower the component towards the board at a relatively high speed, then decelerate as the component is just above the board and gently place the component upon the board. Such placement facilitates high speed, accurate placement. If the height were not known, the placement head would have to decelerate to a low velocity much sooner than otherwise required in order to reduce the risk of jamming delicate components into the circuit board. Such early deceleration to a low velocity increases placement time and board cost. Thus, knowing the distance between the placement head and the circuit board prior to lowering the component allows each individual downward stroke to be optimized for speed and accuracy.

Another advantage provided by height knowledge relates to the accuracy of component placement. If the height is considered the Z-axis, then the placement apparatus can be thought to move along the z-axis as the component is lowered towards the circuit board. The circuit board theoretically defines an X-Y plane such that all X, Y and Z axes are orthogonal. In reality this is not the case. In fact, due to machine tolerance, build variations, and wear over time, the Z-axis is not perfectly perpendicular to the XY plane. This lack of perpendicularity causes errors in placement positions. This is illustrated by imagining that the placement machine drives the placement head exactly to the nominal position X,Y required to place a component at coordinate X,Y on the circuit board. Then the Z axis moves down a distance d to lower the part onto the circuit board. If the Z-axis is out of plumb by an angle p, the component will be placed with an error in the XY plane $e=d*\tan(p)$. While in some high accuracy placement machines it may prove difficult or costly to make the angle p sufficiently small for e to be negligible, it is relatively easy to measure p. If p is known, it is possible to compensate for e by having the placement head move to compensated coordinates X',Y' before placement. The placement head's accuracy is then improved to the extent that p is greater than zero and to the extent that d is unknown.

Another benefit of knowing the height would be to permit a less expensive non-telecentric fiducial finder lens to be used. In a non-telecentric system that has a certain depth of field, an object can be positioned over a range of distances, all within that depth of field and still be in focus. However, since the optic is non-telecentric, the apparent position of the object will have changed (as the object moves within that depth of field) unless, coincidentally, the object happened to be positioned at the center of the field of view. The apparent position change of the object represents a significant problem and drives the design of telecentric system for fiducial finding optics. Such systems have a depth of field, outside of which, an object will blur. However, the apparent position of the object will be substantially constant despite a change in distance. Telecentric optics are more expensive and bulky than non-telecentric optics. Therefore, a fiducial finding system that could use non-telecentric optics would be beneficial. With such a system, the height data could be used to post-process the image or the x-y result from the image to correct for non-telecentricity.

During the fabrication of electronic circuit boards, the boards are conveyed, or otherwise shuttled into a pick-and-place machine. Inside the machine, a circuit board is generally clamped and an assembly operation is performed. The assembly operation generally places components on the circuit board in their appropriate positions in preparation for permanent attachment. Typically, the circuit board is clamped in place, during the assembly operation, along two of the board's edges that are in contact with the shuttle mechanism. After clamping, a support mechanism is generally raised from below the circuit board to support the center of the board. However, even after the board is clamped in place and the support is moved into position, the height of the board may vary from some nominal value. This is due, in part, to the fact that at least some boards while supported from below, may be bent up between the clamps, thus having an unknown height.

While the board under assembly may be bent to a relatively slight degree, advances in circuit board design and miniaturization have made the process ever more sensitive to such inconsistency. Specifically, the parts that must be placed on circuit boards are generally becoming smaller making them harder to handle and more susceptible to mechanical damage. Further, the smaller parts must generally be placed more accurately in order to ensure that they are properly coupled to the circuit board. Additionally, in order to minimize assembly time, and thus product cost, assembly machines are required to operate faster to provide enhanced throughput. Finally, the circuit boards themselves are becoming thinner and more flexible which further increases the variance of board heights.

A number of circuit board assembly operations are susceptible to variances in the board height. Such processes generally require knowledge of the board height and include solder paste inspection, component inspection, component part placement; and glue dispensation.

One method which could be employed to address the problem of varying board height is to actually measure the height between the nozzle and the board at the location under placement prior to the assembly operation. Several types of height measurement sensors are available that can provide such measurement including optical triangulation sensors. However, directly measuring the distance between the placement head and the circuit board directly under the nozzle is impossible for many assembly machines because surrounding parts already placed on the circuit board will generally occlude a clear line of sight at the placement or dispensing location. Further, the physical area around the placement nozzle is limited thus reducing the available choices for mounting locations and incidence angles of the height sensor.

Providing a system that could quickly acquire circuit board height information during placement would enhance circuit board assembly. Further, if a system were provided that required relatively little incremental hardware, adoption of such a system would be facilitated.

SUMMARY OF THE INVENTION

An automated system includes improved height sensing. In one aspect, an on-head camera performs the dual functions of fiducial imaging and height sensing using an auxiliary off-axis light source and triangulation. In another aspect, an on-head height sensor is positioned to measure height at a location that is not beneath any nozzles. The sensor provides height information at a plurality of locations over the board, and a height map of the board is created. In yet another aspect of the invention, the above features are combined to provide an on-head camera that images fiducials and measures height at a plurality of locations such that a height map is created.

DETAILED DESCRIPTION OF THE ILLUSTRATIVE EMBODIMENTS

Although embodiments of the present invention will be described with respect to a pick and place machine, those skilled in the art will recognize that embodiments of the present invention are applicable to a number of other assembly or inspection machines. Further, although the pick and place machine described herein utilizes a placement head that moves relative to the circuit board, such relative motion expressly includes machines that cause the board to move or both the board and the head to move as well.

Figure 1:
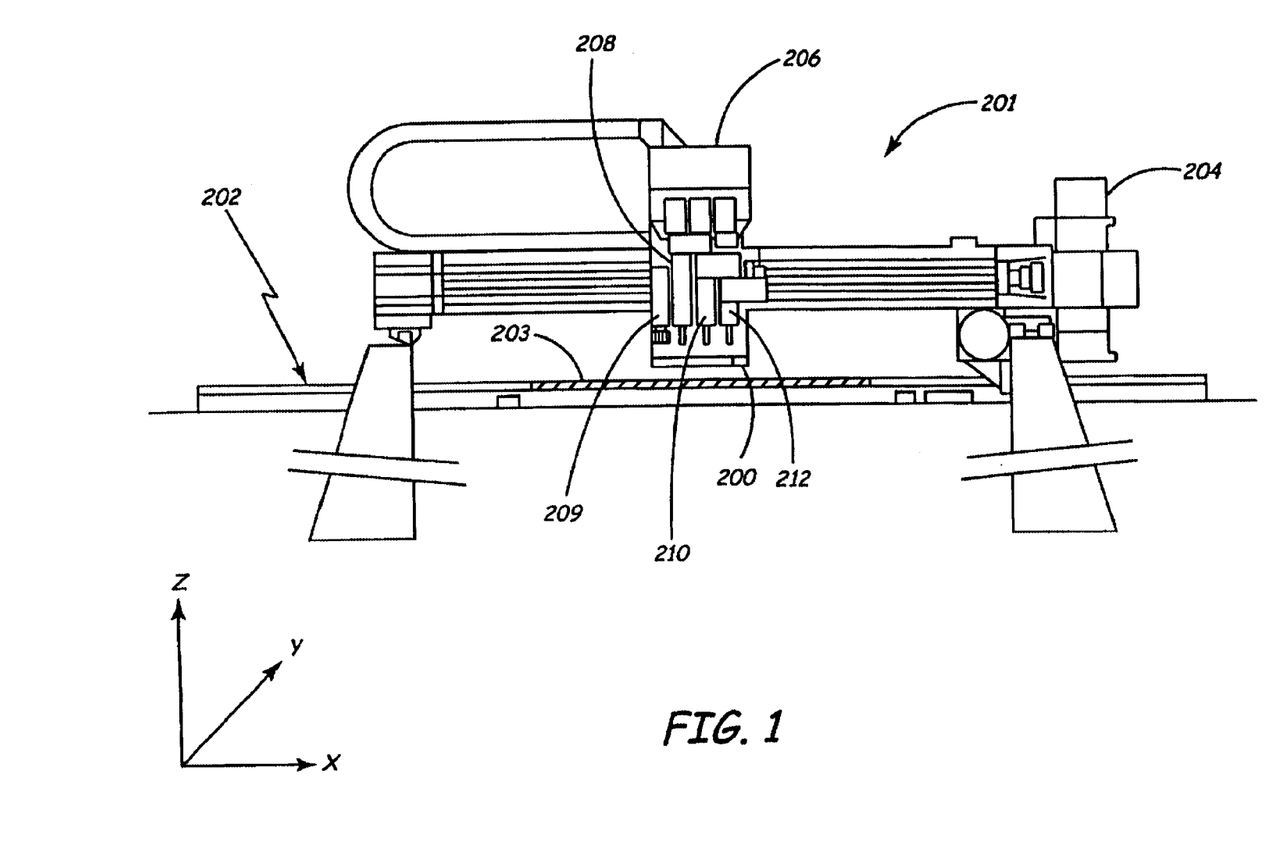
FIG. 1 shows a pick and place machine.

An automated machine, specifically, a pick and place machine, shown generally at 201 in FIG. 1, includes conveyor system 202 for transporting a printed circuit board 203 into a working area. Pick and place machine 201 includes an x and y motor drive assembly at 204 for moving vacuum head 206 independently in the x and y directions. Attached to head 206 are multiple vacuum nozzles 208, 210, 212 for releasably holding one or more components. Head 206 picks up each of the three components at trays (not shown) and while head 206 is transporting the components to printed circuit board 203, sensor 200 senses the x,y and theta orientation of the components. Since sensor 200 is positioned on head 206, it is considered an on-head sensor and senses the x,y and theta orientation of the components while head 206 transports the components to board 203. FIG. 1 also illustrates camera 209 located on head 206. Generally, a camera positioned on a placement head is used to image reference marks or "fiducials" located on the circuit board in order to provide location information to machine 201. As will be described in more detail below, some embodiments of the invention provide an additional light source for operation in conjunction with camera 209 to allow camera 209 to provide height information relative to the distance between placement head 206 and board 203.

Figure 2:
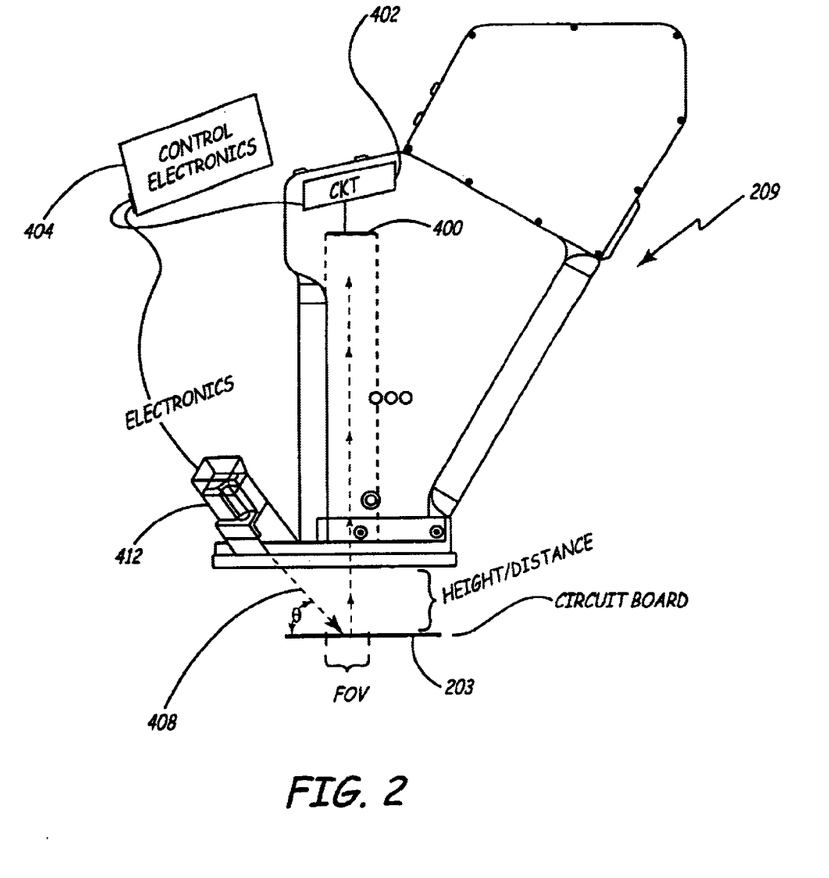
FIG. 2 is a diagrammatic view of a height sensing camera in accordance with an embodiment of the present invention.

FIG. 2 is a diagrammatic view of camera 209 in accordance with an embodiment of the present invention. Camera 209 includes detector 400 which may be a Charge Coupled Device (CCD) array, or a Complementary Metal Oxide Semiconductor (CMOS) detector array. Camera 209 also includes circuit 402, control electronics 404 and angled light source 412. Camera 209 is coupled to head 206 and is used for two purposes. First, camera 209 is used to image fiducials just as prior art systems do. However, camera 209 is also used as a height sensor. As illustrated, angled light source 412 generates a beam 408 of light that impinges upon board 203 in the field of view (FOV) of detector 400 at an angle theta ($\theta$) that is greater than zero degrees and less than ninety degrees. Since beam 408 impinges board 203 formed on detector 400 will vary based upon the distance between board 203 and head 206.

Figure 3:
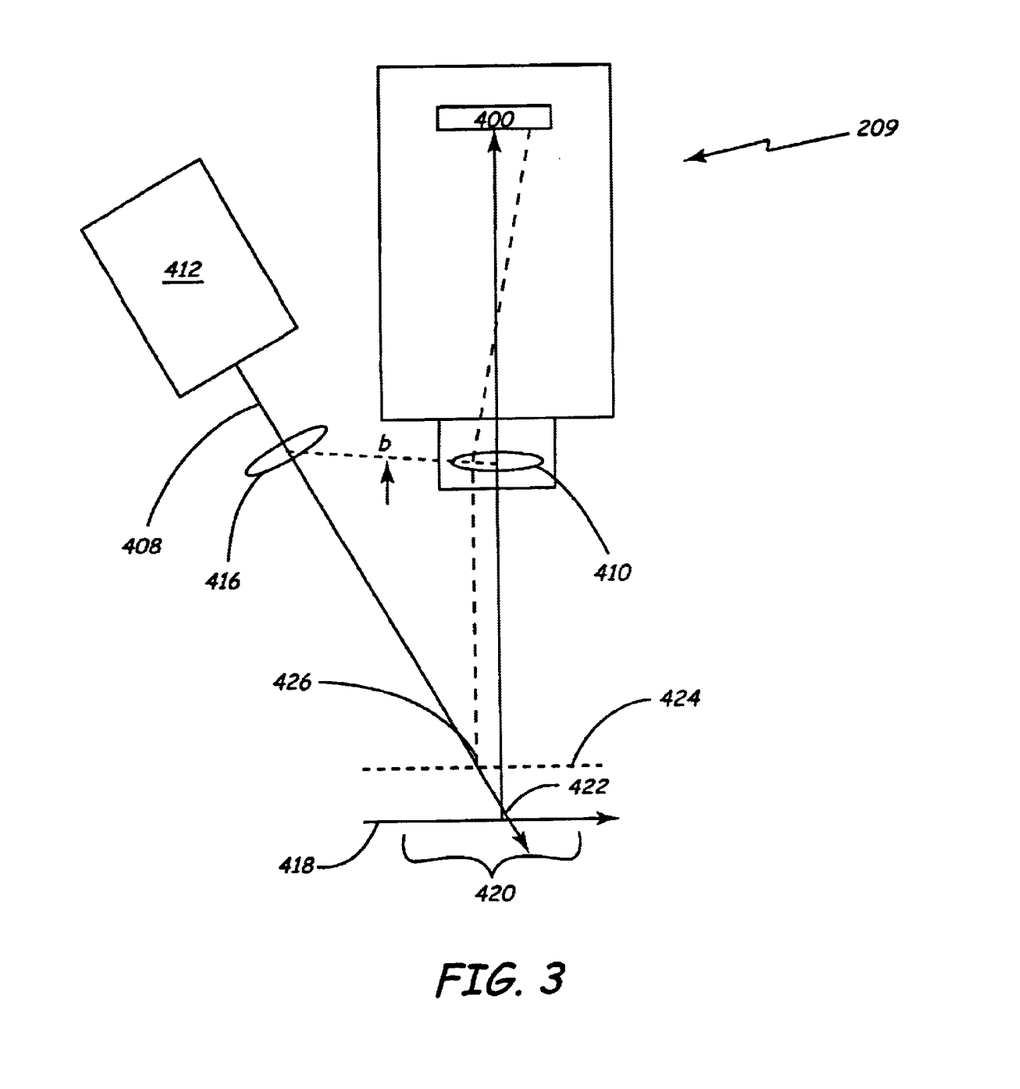
FIG. 3 is a simplified diagrammatic illustration of a height sensing camera in accordance with an embodiment of the present invention.

FIG. 3 is a simplified diagrammatic view of a height sensing system in accordance with an embodiment of the present invention. Camera 209 includes detector 400 positioned such that an image passing through lens 410 is focused on detector 400. Off-axis point light source 412 directs a beam of light 408 through lens 416 such that it impinges upon surface 418 within field of view 420 of detector 400. Beam 408 forms a spot or pattern upon surface 418 at location 422 and an image thereof is focused by lens 410 to be imaged on detector 400. The location of the spot on detector 400 is indicative of the distance between surface 418 and sensor lens 410. This relationship is illustrated as follows. If surface 418 is positioned as indicated at dashed line 424, beam 408 will form a spot or pattern at location 426. To detector 400, the location 426 will appear shifted to the right when compared with location 422. Since the angle of incidence of beam 408 is known, and since the distance between lenses 416 and 410 is known, the only remaining unknown (height) can be obtained.

Figure 4:
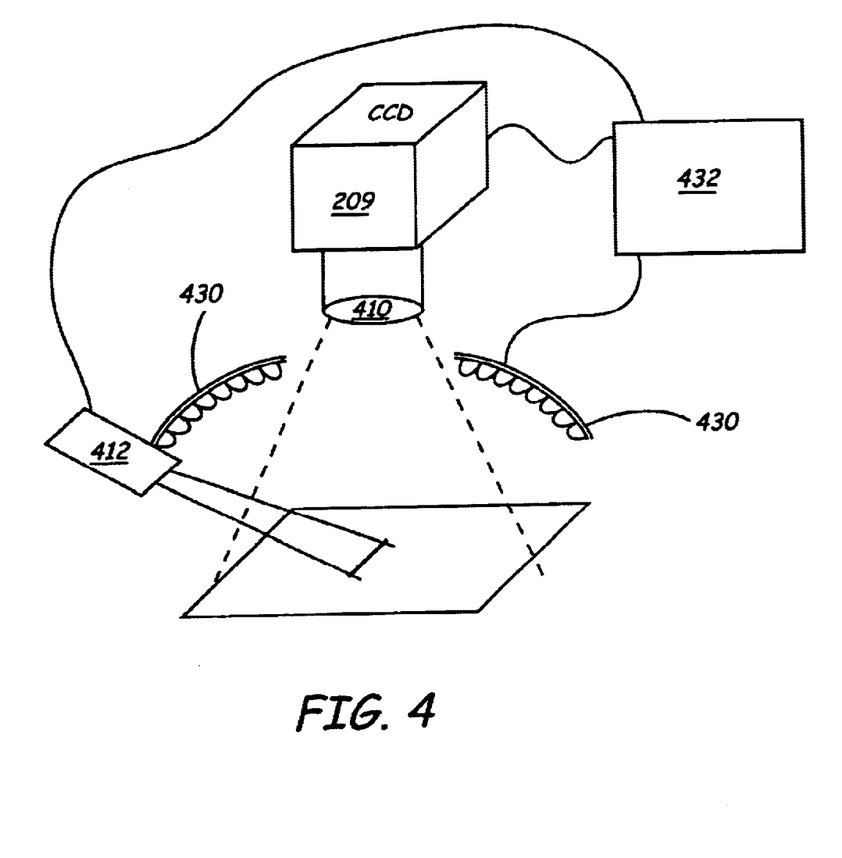
FIG. 4 is a diagrammatic view of a height sensing camera illustrating both an off-axis light source and general purpose illuminators.

FIG. 4, is a diagrammatic view of camera 209 adapted to operate as both a height sensor and fiducial imaging device. As described with respect to FIGS. 2 and 3, camera 209 operates in conjunction with angled light source 412 to sense height. Source 412 can be any suitable source for generating a beam of light. Source 412 may include structured or unstructured light, and may include LED's, and/or white light. In accordance with an embodiment of the invention, camera 209 not only senses range, but also senses fiducials using general purpose illuminators 430. Preferably, illuminators 430 are Light Emitting Diodes (LED's). Camera 209, source 412 and illuminators 430 are coupled to controller 432. Controller 432 selects which illumination source to use, and which function camera 209 will perform. Thus, when height is to be sensed, source 412 is energized, illuminators 430 are de-energized and the image acquired by camera 209 is used to determine height. When a fiducial is to be imaged, source 412 is de-energized and illuminators 430 are energized, and the image(s) acquired by camera 209 are used in accordance with known techniques to determine fiducial location. Preferably, controller 432 sequences the acquisition of images such that one image is formed using off-axis illuminator 412, and another image is formed using illuminators 430. Alternately, controller 432 can energize both source 412 and illuminators 430 such that an image is acquired while both are energized so long as the return signals are differentiable (e.g. different wavelengths, intensities, locations). In one embodiment, the images are acquired in rapid succession as described in U.S. patent application Ser. No. 09/522,519, filed Mar. 10, 2000, entitled "INSPECTION SYSTEM WITH VIBRATION RESISTANT VIDEO CAPTURE", which application is herein incorporated by reference.

Although the combined imaging and height sensing described above has been related to pick and place machines, other automated assembly or inspection machines can benefit from these embodiments. For example, machines such as solder paste inspection systems; component inspection systems; and glue dispensing systems can all benefit from the height sensing imager described above.

Figure 5:
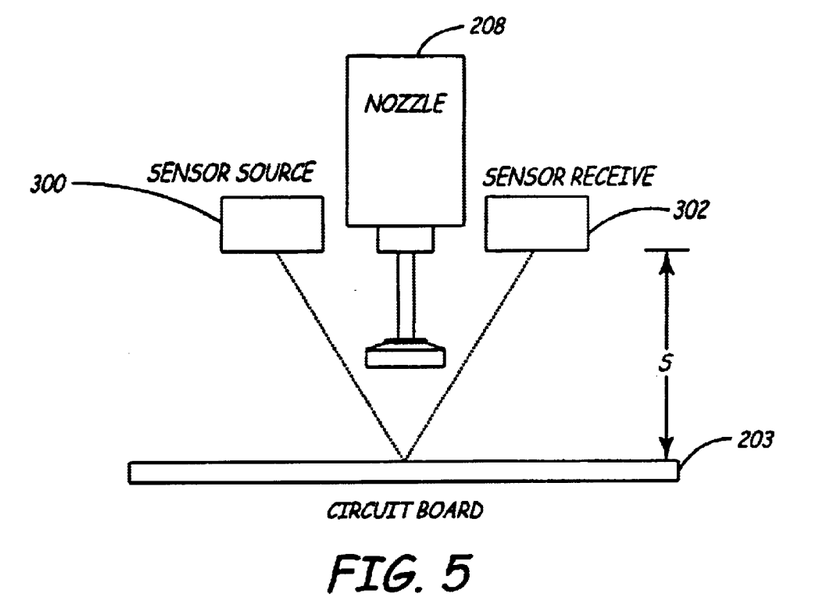
FIG. 5 is a diagrammatic view of a height sensor that senses height directly below a nozzle.

One of the advantages of using a camera, such as camera 209 for height sensing, is that the height measurement is done at a location spaced (in the x or y direction) from the nozzles themselves. FIG. 5 illustrates a range sensor including sensor source 300 and sensor receiver 302 operating in conjunction with nozzle 208 to sense height h to board 203. FIG. 5 illustrates the difficulty of measuring height directly beneath nozzle 208 because it requires a pair of components (such as source 300 and receiver 302) disposed relatively closely to the nozzle and oriented to measure height directly beneath the nozzle.

Figure 6:
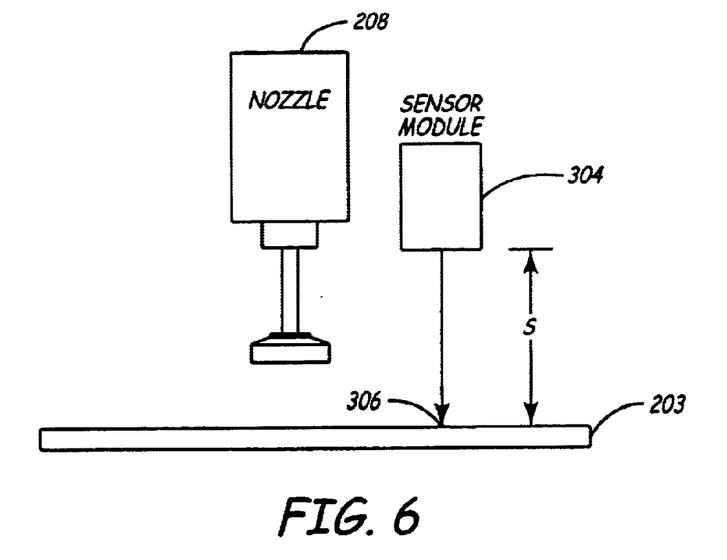
FIG. 6 is a diagrammatic view of a height sensor sensing height away from a nozzle in accordance with an embodiment of the present invention.

FIG. 6 illustrates a height sensing arrangement in accordance with an embodiment of the present invention. Specifically, height sensor 304 is disposed relative to nozzle 208 such that it measures a height h from circuit board 203 at a location 306 that is not located directly beneath nozzle 208. Height sensor 304 may be any suitable device, but is preferably a height sensor that uses a fiducial imaging camera as set forth above. Height sensor 304 can include any suitable position sensitive detector, including a photodiode array, a lateral effect photodiode array, a bi-cell array, a quad-cell array, or an inter-digitated photodiode array. Placing height measurement sensor 304 at a location remote from the placement location can give an estimation of board height. However, a single height measurement that is located away from the placement location is generally not reliable due to local height variations in the board and the presence of previously placed components. In order to provide effective height information, sensor module 304 is coupled to the placement head itself and accumulates height data as the placement head moves. These height data and x,y location information are combined to construct a height profile of circuit board 203. This profile can then be used to calculate height directly under nozzle 208. Thus, by mounting sensor 208 on the placement head of an assembly machine and providing a method for accumulating height data and x-y location data while the height sensor 304 is moved over circuit board 203, a topographical height map of board 203 is obtained. Even in the presence of sparse height data, it is possible to filter the data to allow the height of all locations of the board to be determined, even when the board is populated with components. Further, an height uncertainty can also be provided. Subsequent access to this profile allows the assembly machine to determine the height of board 203 at the next dispense or placement location. The location of sensor 304 upon the placement head is not critical as long as sensor module 304 is in fact disposed on the placement head and its position on the placement head relative to the nozzle is approximately known. However, it is believed that better results can be obtained by placing height sensor 304 relatively close to the placement nozzles.

As the assembly machine performs its operation, the assembly head moves over circuit board 203 in an approximately predetermined pick point and place point. During this travel over board 203, sensor 304 is continuously acquiring height data from board 203 and x,y position data of the nozzle, and therefore the sensor, as indicated by the x,y position encoders. Encoders are provided as an example of position measuring means. Such means also include x,y step counters, interferometers, variable resistors and accelerometers. The height data is then combined with the known actual position of the assembly head to produce a sparse height map of circuit board 203. After filtering height data to remove erroneous data points such as those caused by vias, previously placed components and solder paste, a mathematical function is fit to the data set using well known numerical techniques. Thereafter, when the height of an unknown location is required for the assembly machine, the assembly machine's controller can request the height at that location through a communications interface to the board mapping processor.

Figure 7:
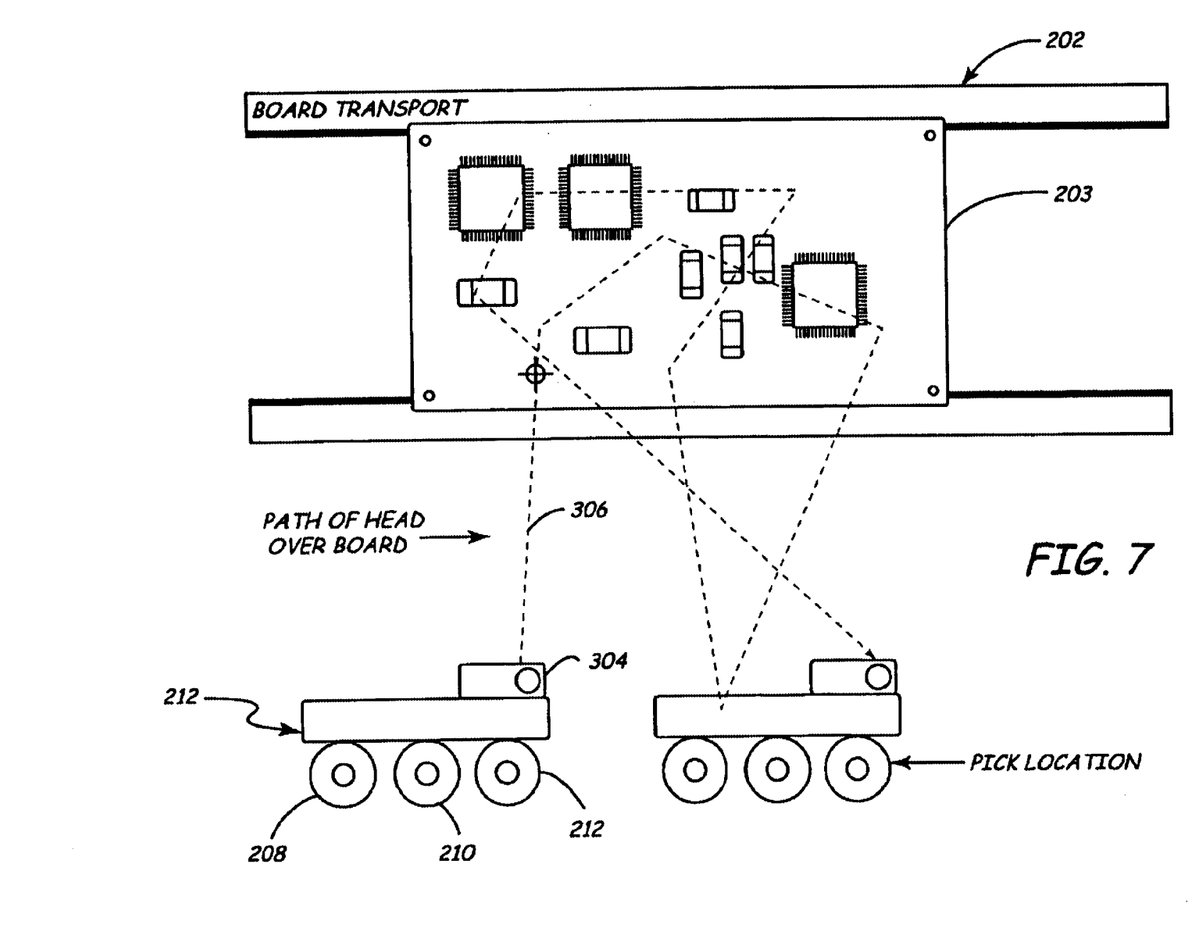
FIG. 7 is a diagrammatic view of a placement head path relative to a circuit board.

FIG. 7 illustrates the placement of height sensor 304 on a placement head of a pick and place machine as it moves relative to the board to both find fiducials and place components. Dashed line 306 represents a potential path for assembly head 212 over circuit board 203. Sensor 304 acquires height data whenever the motion of 212 brings sensor 304 over board 203. Even though sensor 304 does not see the entirety of board 203, the height of 203 can be derived after only a few passes over board 203.

Figure 8:
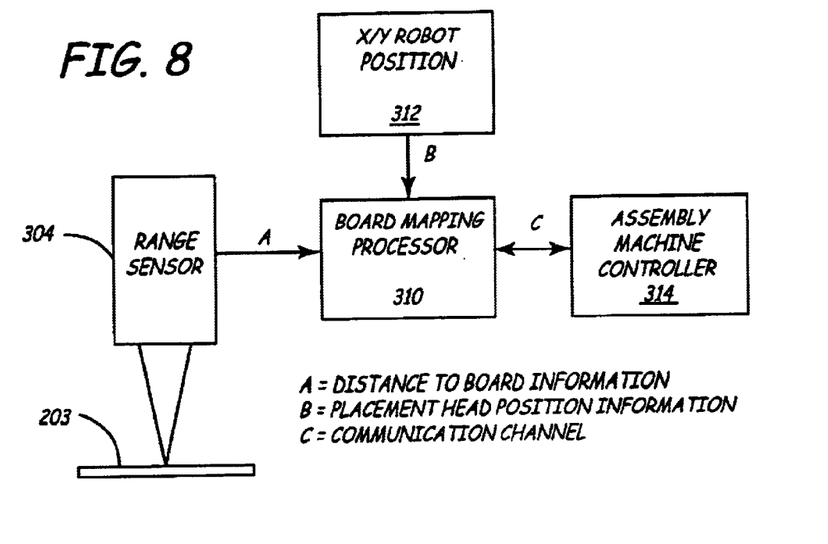
FIG. 8 is a block diagram of a circuit board height mapping system in accordance with an embodiment of the present invention.

FIG. 8 is a block diagram illustrating functions used to produce a height map using embodiments of the present invention. Sensor 304 sends data to board mapping processor 310 which combines the height data with encoder information received from x/y robot encoders 312. These raw data are processed as described above to generate an estimate of the surface height of the board. The machine controller 314 can then query the board mapping processor for an estimate of the board height at any desired x,y coordinate by specifying that coordinate in the query. For example, when the assembly machine is required to place or dispense at an x-y location, it generally requests the height for that location from board mapping processor 310. Using the most recently calculated height map of the board, board mapping processor 310 determines an estimate of height at the requested x, y location and communicates the data back to assembly machine controller 314.

Figure 9:
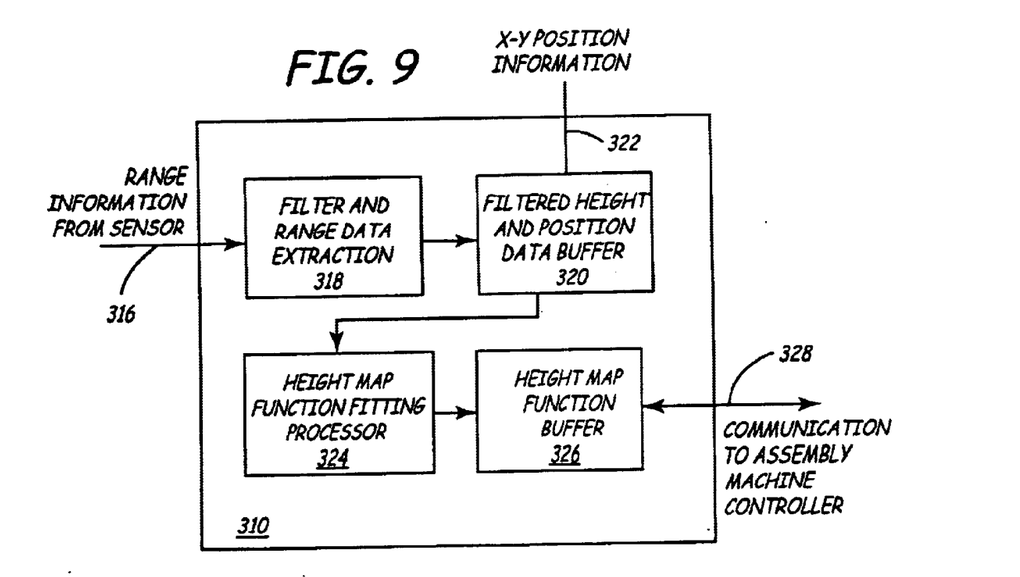
FIG. 9 is a functional block diagram of a board mapping processor.

FIG. 9 is a block diagram illustrating functions incorporated into board mapping processor 310. In order to determine the height of positions not directly measured beneath sensor 304, a processor mathematically fits a two-dimensional function to the filtered height data. Height sensor 304 provides data 316 that is stored in processing board 310 and is combined with the location data generated by encoders 322. The processor board also filters the data at step 318 to move erroneous height data caused by vias, previously placed components, and other objects. This filtering can be accomplished by using a histogram median techniques, median filtering, or other suitable methods. The filtered data is then stored in a buffer and can be further updated when more data is acquired from subsequent passes over board 203.

Once the filtered height data is stored with position information, a mathematically derived two-dimensional function is calculated by function fitting processor 324 that fits the available data. Previously acquired and calculated height maps can be compared with newly acquired data to determine goodness of fit measure. This function and the fitting algorithms are well known. As additional data are acquired, the height function can be recomputed to further refine the height map of the board. When the height map is generated, the assembly machine can request and receive height information from function 326 for the next assembly operation location on board 203.

As illustrated in FIG. 9, range information is received from sensor 304 as indicated at arrow 316. This information is provided to filter and range data extraction module 318 which operates as described above. The filtered data is provided to raw height data buffer 320 which also receives x,y position information from position measuring means such as encoders 312, indicated by arrow 322. The combined filtered height information and encoder information is provided from buffer 320 to height map function fitting processor 324. Processor 324 operates as described above to provide a two-dimensional function that fits the available data. The height map function is then provided to height map function buffer 326 which communicates with assembly machine controller 314 as indicated by arrow 328.

Although the present invention has been described with reference to preferred embodiments, workers skilled in the art will recognize that changes may be made in form and detail without departing from the spirit and scope of the invention.

What is claimed is:

1. An assembly machine for operating upon a workpiece, the workpiece having a contour associated therewith, the machine comprising:
    a head releasably grasping a component and placing the component on the workpiece;
    position measuring means for providing a plurality of x-y positions of the head relative to the workpiece;
    a sensor for sensing a distance from the sensor to the workpiece, the sensor mounted on the head and traveling relative to the workpiece therewith;
    a processor coupled to the sensor and to the position measuring means for computing an initial height map representative of the contour of the workpiece as a function of the measured distance and the x-y positions.

2. The machine of claim 1 where a computer in the machine sends movement instructions to the head.

3. The machine of claim 2 where the processor is integrated into the computer.

4. The machine of claim 1 wherein the workpiece is a circuit board.

5. The machine of claim 1 wherein the initial height map is computed from a first set of movements of the sensor relative to the workpiece and an additional height map is computed from the initial height map and additional movements of the sensor relative to the workpiece.

6. The machine of claim 1 where the initial height map is comprised of an initial set of points, and additional points are added to the initial height map as additional components are placed to form a refined height map.

7. The machine of claim 1 where the processor computes an intended placement position of the component as a function of the initial height map.

8. The machine of claim 1, wherein the sensor includes a photodiode array.

9. The sensor of claim 8, wherein optics of the detector are non-telecentric.

10. The sensor of claim 8, wherein optics of the detector are telecentric.

11. The sensor of claim 1, wherein the sensor includes a lateral effect photodiode.

12. The sensor of claim 1, wherein the sensor includes a bi-cell array.

13. The sensor of claim 1, wherein the sensor includes a quad-cell array.

14. The sensor of claim 1, wherein the sensor includes an inter-digitated photodiode array.

15. A triangulation height sensor for determining a height of a workpiece board, the sensor comprising:
    a detector having a field of view substantially perpendicular to an optical axis thereof;
    an illuminator adapted to illuminate the workpiece board;
    an off-axis light source directed at the field of view and disposed to direct light at an angle with respect to the optical axis of the detector; and
    a controller coupled to the detector and the off-axis light source, the controller being adapted to control the detector and the off-axis light source to compute height.

16. The sensor of claim 15, wherein sensor is disposed within a solder paste inspection system.

17. The sensor of claim 15, wherein the sensor is disposed within a pick and place system.

18. The sensor of claim 15, wherein the sensor is disposed within an article inspection system.

19. The sensor of claim 15, wherein the sensor is disposed within a glue dispensing system.

20. The sensor of claim 15, wherein the detector includes a Charge Coupled Device (CCD) array.

21. The sensor of claim 15, wherein the detector includes a Complementary Metal Oxide Semiconductor (CMOS) array.

22. The sensor of claim 15, wherein the off-axis light source is a coherent light source.

23. The sensor of claim 15, wherein the off-axis light source includes a Light Emitting Diode.

24. The sensor of claim 15, wherein the off-axis light source includes a white light source.

25. A pick and place machine for placing a plurality of components on a circuit board, the machine comprising:

a head having at least one nozzle disposed thereon and adapted such that relative movement can occur between the circuit board and the head, such that the nozzle is movable to pick up a selected component and place the selected component upon the circuit board;

a camera disposed on the placement head spaced from the at least one nozzle and having an optical axis;

an illuminator positioned to illuminate a field of view on the circuit board in order to image a reference location; and an off-axis light source disposed to direct light at an angle with respect to the optical axis in order to sense height between the camera and the board; and a controller coupled to the camera, the illuminator and the off-axis light source, the controller including a board mapping processor adapted to compute a height map based upon the sensed height information and location information.

26. The machine of claim 25, and further comprising:

a buffer;

position measuring means for providing the location information related to a position of the placement head relative to the board; and wherein the controller energizes the off-axis light source at different positions on the board, and wherein the controller computes height information for the different positions and stores the height information and the location information in the buffer.

27. The machine of claim 26, wherein the controller is adapted to generate a height map based upon the location information and the stored height information.

28. A method of measuring a distance from a sensor to a workpiece in an automated measurement system, the method comprising:

using the sensor to perform an imaging function substantially unrelated to distance measurement;

energizing an off-axis illuminator to generate a beam impinging the workpiece at an angle relative to an optical axis of the sensor;

using the sensor to sense an image of the beam impinging upon the workpiece; and computing a distance from the sensor to the workpiece based upon the sensed image.

29. A height sensor for determining a height map of a workpiece, the sensor comprising:

a detector having a field of view substantially perpendicular to an optical axis thereof;

an illuminator adapted to illuminate the workpiece;

a light source disposed to direct light at a region of the workpiece such that an image of that region of the workpiece will appear in the detector and disposed to direct light at an angle with respect to the optical axis of the detector; and a controller coupled to the detector and the light source, the controller being adapted to control the detector and the light source to compute height.

30. The sensor of claim 29, wherein the light source is disposed to direct light substantially parallel to the sensor's axis of range measurement.

31. The sensor of claim 29, wherein the light source is disposed to direct light at an angle to the axis of range measurement.

32. A workpiece inspection machine, the machine comprising:

a head adapted such that relative movement can occur between the workpiece and the head;

a camera disposed on the head and having an optical axis;

an illuminator positioned to illuminate a field of view on the workpiece in order to image a reference location; and a light source disposed to direct light at an angle with respect to the optical axis in order to sense height between the camera and the workpiece; and a controller coupled to the camera, the illuminator and the light source, the controller including a workpiece mapping processor adapted to compute a height map based upon the sensed height information and the reference location.

* * * * *